(12) United States Patent
Ryabova et al.

(10) Patent No.: US 7,919,722 B2
(45) Date of Patent: Apr. 5, 2011

(54) METHOD FOR FABRICATING PLASMA REACTOR PARTS

(75) Inventors: Elmira Ryabova, Mountain View, CA (US); Jennifer Sun, Sunnyvale, CA (US); Jie Yuan, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 926 days.

(21) Appl. No.: 11/766,626

(22) Filed: Jun. 21, 2007

(65) Prior Publication Data
US 2008/0099148 A1 May 1, 2008

Related U.S. Application Data

(63) Continuation-in-part of application No. 11/554,482, filed on Oct. 30, 2006.

(51) Int. Cl.
*B23K 10/00* (2006.01)

(52) U.S. Cl. .............. 219/121.43; 219/497; 219/121.48; 118/725

(58) Field of Classification Search ............. 219/121.41, 219/121.43, 121.44, 121.59, 121.48; 118/723 R, 118/724, 725
See application file for complete search history.

(56) References Cited

U.S. PATENT DOCUMENTS

| | | | |
|---|---|---|---|
| 4,732,622 A | 3/1988 | Jones | |
| 4,755,492 A | 7/1988 | Greskovich et al. | |
| 5,188,676 A | 2/1993 | Taylor | |
| 5,578,145 A | 11/1996 | Adamson et al. | |
| 6,853,141 B2 | 2/2005 | Hoffman et al. | |
| 6,949,486 B2 | 9/2005 | Sasaki et al. | |
| 2004/0159984 A1 | 8/2004 | Isomura et al. | |
| 2006/0000802 A1 | 1/2006 | Kumar et al. | |
| 2006/0043067 A1 | 3/2006 | Kadkhodayan et al. | |
| 2006/0243358 A1 | 11/2006 | Colburn et al. | |
| 2008/0207432 A1 | 8/2008 | Hamada | |

FOREIGN PATENT DOCUMENTS

| | | |
|---|---|---|
| EP | 0 263 662 | 4/1988 |
| JP | 63123813 A | 5/1988 |
| JP | 2002 068838 | 3/2002 |
| JP | 2002 255647 | 9/2002 |
| JP | 2004 269350 | 9/2004 |
| JP | 2004269350 A | 9/2004 |
| JP | 2004 292270 | 10/2004 |
| JP | 2005 170728 | 6/2005 |
| JP | 2005 335991 | 12/2005 |
| JP | 2006 021990 | 1/2006 |
| KR | 20060054358 A | 5/2006 |
| KR | 10-2006-0054358 | 5/2008 |
| WO | WO 2005009919 A1 | 2/2005 |

OTHER PUBLICATIONS

Extended European Search Report dated Feb. 21, 2008 for Application No. 07018393.4.

(Continued)

*Primary Examiner* — Mark H Paschall
(74) *Attorney, Agent, or Firm* — Patterson & Sheridan, LLP

(57) ABSTRACT

A method of fabricating yttria parts is provided herein. In one embodiment, the method includes sintering a yttria sample, machining the sintered sample to form a part, and annealing the part by heating the part at a predetermined heating rate, maintaining the part at a constant annealing temperature, and cooling the part at a predetermined cooling rate. At least one of the sintering and annealing atmospheres is an oxygen-containing atmosphere.

20 Claims, 4 Drawing Sheets

OTHER PUBLICATIONS

Notice to File a Response for Korean Patent Application No. 10-2007-0108776 dated Jul. 28, 2009.

Sajgalik, "Importance of Chemistry in High-Tech Ceramics Design", *Pure Appl. Chem.*, vol. 74, No. 11, pp. 2137-2144, 2002.

Office Action dated Oct. 21, 2008 for Korean Patent Application No. 10-2007-0108776.

METHOD FOR FABRICATING PLASMA REACTOR PARTS

CROSS-REFERENCE TO RELATED APPLICATION

This application is a continuation-in-part of U.S. patent application Ser. No. 11/554,482, entitled "Method and Apparatus for Photomask Etching", filed on Oct. 30, 2006 (APPM/11450), which is herein incorporated by reference in its entirety.

BACKGROUND

1. Field

Embodiments of the present invention generally relate to a method and apparatus for plasma processing and, more specifically, to a method and apparatus for plasma processing with improved component parts.

2. Description of the Related Art

The fabrication of microelectronics or integrated circuit devices typically involves a complicated process sequence requiring hundreds of individual steps performed on semiconductors, dielectric and conductive substrates. Examples of these process steps include oxidation, diffusion, ion implantation, thin film deposition, cleaning, etching and lithography. Plasma processes are often used for thin film deposition and etching, which are performed in a plasma chamber. In chemical vapor deposition, reactive species are generated by applying voltages to suitable process gases, and subsequent chemical reactions result in the formation of a thin film on a substrate. In plasma etching, a previously deposited film is exposed to the reactive species in a plasma, often through a patterned mask layer formed in a prior lithography step. Reactions between the reactive species and the deposited film result in the removal, or etching, of the deposited film.

When chamber parts or process kits are exposed to the plasma environment for extended periods, deterioration may occur due to reaction with the plasma species. For example, existing process kits or component parts of a plasma chamber are often made of alumina (aluminum oxide). Halogen-containing gases, e.g., fluorine- or chlorine-containing gases, are used in etching various material layers in circuit fabrication. It is believed that alumina is vulnerable to attack by fluorine species, resulting in the formation of $Al_xF_yO_z$ on the surface of component parts. Such etch by-product may come off as particles during processing, resulting in contamination and defects on the mask substrate. Furthermore, some alumina parts seem to be susceptible to breakage, probably as a result of mechanical stress created during machining. Thus, there is a need for alternative ceramic materials suitable for use as component parts for plasma applications, and for improved processes for fabricating such materials.

SUMMARY

One embodiment of the invention provides a method of fabricating an yttria part, in which a sintered yttria sample is machined to form the part, and the part is annealed after machining. More particularly, the method includes: (a) providing a yttria sample, (b) sintering the yttria sample, (c) machining the sintered yttria sample to form a part, and (d) annealing the part, in which annealing the part further includes: (d1) exposing the part to an annealing gas in an enclosure, (d2) heating the part from a first temperature to a second temperature over a first time period, (d3) maintaining the part at the second temperature for a second time period, and (d4) cooling the part from the second temperature to the first temperature over a third time period. At least one of the sintering and annealing is performed in an oxygen-containing atmosphere, and (d2) and (d4) are performed at respective predetermined heating and cooling rates, the predetermined heating and cooling rates being selected based on at least the sintering atmosphere.

Another embodiment of the invention provides a plasma process chamber, which includes: a chamber body, a part made of at least about 99.5 percent yttria disposed in the chamber body, a support pedestal disposed in the chamber body and adapted to receive a substrate thereon, and a power source for forming a plasma within the chamber, in which the part is one of a gas distribution plate, a ring or a chamber liner.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary embodiments of this invention and are therefore not to be considered limiting of its scope, for the invention may admit to other equally effective embodiments.

DETAILED DESCRIPTION

Certain embodiments of the present invention provide a method for fabricating parts made of bulk or solid yttria with improved characteristics such as reduced stress and enhanced chemical resistance. Certain other embodiments include chamber components made of bulk or solid yttria with improved characteristics, and processing chambers utilizing the same. Specifically, it is found that such improved characteristics are obtained if a part is subjected to a high temperature anneal after it is machined. Additionally, such characteristics may be further improved if the part is sintered or annealed in an oxygen containing environment.

Figure 1:
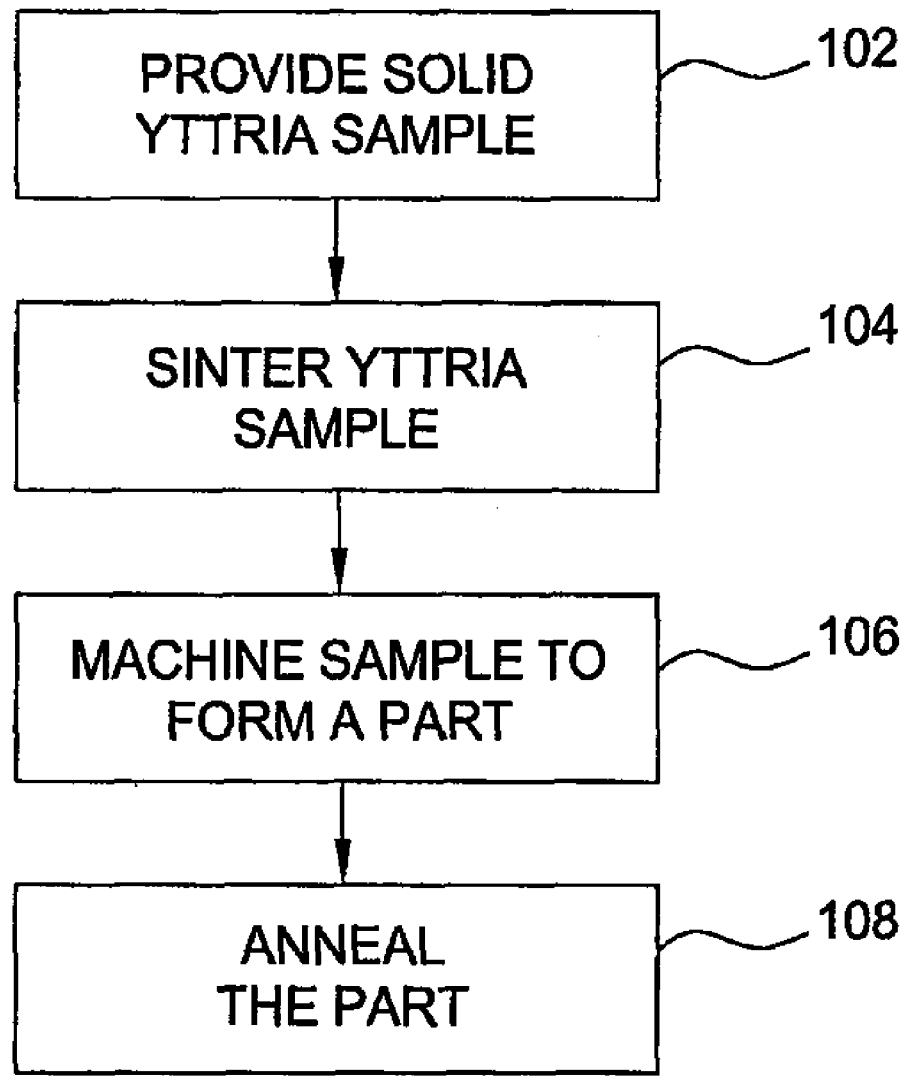
FIG. 1 is a schematic illustration of a method for fabricating bulk yttria parts according to certain embodiments of the invention.

FIG. 1 illustrates one embodiment of a method 100 that can be used to fabricate these improved yttria parts. A solid yttria sample is provided at the beginning of the process in block 102 of the method 100. The solid yttria sample may be made by a variety of techniques known to one skilled in the art. For example, yttria (yttrium oxide, $Y_2O_3$) in powder form may be used as the starting material, and a slurry is formed by adding other components such as water, binder, and suitable additives that may be used to facilitate the fabrication process or to enhance the properties of the parts. After drying, the slurry is press-molded into a block to form the solid yttria sample.

At block 104, the solid yttria sample is sintered by exposing it to a high temperature environment, which causes the yttria particles to fuse together. Depending on specific application needs, sintering may be performed by exposing the yttria solid sample to various gaseous atmospheres or environments. In one embodiment, sintering is performed under an oxygen-containing atmosphere, for example, a mixture containing oxygen ($O_2$) and nitrogen ($N_2$), with an $O_2$ partial pressure ranging from about 0.001 atmosphere (atm.) to about 1 atm. The annealing may be done at a total pressure during of about 1 atm., although other pressures may also be used. In another embodiment, the sintering mixture has an $O_2$ concentration of at least about 2 percent by volume. In another embodiment, sintering is performed under an inert or non-oxidative atmosphere, e.g., nitrogen ($N_2$), or other inert gases.

After sintering, the yttria sample is machined into a part, as shown in block 106. In general, the part may be any component part of different equipment or machines, and may be have a variety of shapes or dimensions. In one embodiment, the machined part is a component of a plasma processing chamber, with a purity level higher than about 99.9 percent. In other embodiments, samples with a purity level higher than about 99.5 percent yttria are also suitable for use in plasma processing chambers.

At block 108, the machined part is subjected to an annealing process at an elevated temperature under controlled conditions. The choice of one or more of the annealing conditions, e.g., annealing gas, heating or cooling rates, may depend on the specific sintering atmosphere used in preparing the yttria sample. According to one embodiment of the invention, at least one of the sintering or annealing is performed under an oxygen-containing atmosphere. The selection of the heating and cooling rates during annealing also depend on the sintering atmosphere used. After annealing, the part may undergo further processing, as needed, to prepare it for use or installation.

According to one embodiment of the present invention, the annealing process at block 108 comprises three stages. During the first stage, the part is exposed to an annealing gas and subjected to a ramp-up heating from a first temperature, e.g., ambient temperature, to a second, predetermined, temperature. In the second stage, the part is maintained at the second temperature (the annealing temperature) for a time period that is sufficient to substantially relieve any stress that might have been created or induced by the previous machining operation, and to provide the desired chemical resistance. In the third stage, the part is subjected to a ramp-down cooling back to the first temperature.

As previously mentioned, the sintering atmosphere may affect the choice of one or more of the annealing conditions. For example, if the sintering process at block 104 is done in an inert or non-oxidative atmosphere such as $N_2$, or other inert gases, the yttria part will be exposed to an oxygen-containing gas during at least part of the annealing process. In one embodiment, the annealing gas is a mixture with an $O_2$ concentration of about 10 percent by volume, with the balance being $N_2$ or other inert gases.

On the other hand, if the sintering is done in an oxygen-containing atmosphere, then there is no need to expose the part to an oxygen-containing atmosphere during annealing.

In addition, for yttria samples that have been sintered under an inert or non-oxidative atmosphere, a more careful control of the annealing conditions may be needed, since outgassing from the samples may change the gas environment around the samples. Thus, circulation of the annealing gas may be provided to ensure a more uniform exposure of the yttria part to the annealing atmosphere, with periodical monitoring of various parameters such as temperatures, pressures and gas compositions.

In one embodiment, the annealing process at block 108 is performed in an oven with air at atmospheric pressure. Using air as the annealing gas offers the advantages of both convenience and relatively low cost. For some yttria parts of interest, e.g., those with a purity level of at least about 99.5 percent yttria, annealing in air is sufficient to provide the desired properties in the finished parts, and there is no particular need for gas mixtures with more active components such as a reducing or oxidizing atmosphere. Other inert or non-reactive atmospheres may also be used for annealing the yttria parts, e.g., nitrogen, argon, among others, or mixtures thereof; or other relatively inert mixtures with oxygen concentrations different from that of air. Depending on the specific applications, certain parts may benefit from the use of forming gas (e.g., a mixture of 4 percent or less than 10 percent by volume of hydrogen in nitrogen), or gas mixtures containing different concentrations of hydrogen, or reducing or oxidizing gases. For example, if surface modification is needed, e.g., chemical modification or passivation, then annealing may be done in a reducing or oxidizing environment, as appropriate.

In another embodiment in which sintering of the solid yttria sample is performed under a non-oxidative or inert atmosphere, the annealing gas comprises an oxygen-containing atmosphere, e.g., an oxygen concentration of at least about 10 percent by volume.

The annealing can be done under a static or gas flow environment. The static condition offers the advantage of reduced cost, while the gas flow configuration is beneficial for annealing involving chemical reactions with the sample so that a fresh supply of the annealing gas can be maintained. For parts with certain geometric shapes or features such as grooves, it may also be advantageous to use turbulent flow as opposed to laminar flow conditions.

The ramp-up heating and ramp-down cooling rates during the annealing process are controlled to be sufficiently slow in order to minimize stress that might arise from non-uniform thermal expansion or contraction, while high enough to provide a practical throughput for the process. Thus, each of the ramp-up heating and ramp-down cooling stages may take place over a time period from about 8 hours to about 48 hours, with the specific time being dependent on the specific parts.

In addition to the size, shape, surface area to volume ratio, and thermal properties of the parts such as coefficient of thermal expansion or thermal capacity, the sintering atmosphere used in forming the yttria sample also affects the choice of the heating or cooling rates during annealing. Thus, according to one embodiment, the heating and cooling rates are selected based at least on the sintering atmosphere used during sintering. It is believed that the sintering ambient results in certain changes to the surface properties of the yttria sample, and thus, a corresponding adjustment to the annealing conditions may be needed to ensure proper bulk properties transition. In general, samples with higher local concentrations of stress or strain would require slower heating and cooling rates. Thus, parameters such as shape and thickness of the sample tend to be more important in determining the ramp-up heating or ramp-down cooling rates.

In one embodiment, a steady or constant heating rate is used, and is controlled such that an external temperature gradient does not exceed about 1 Kelvin per centimeter (K/cm) near the surface of the part. In this context, the external temperature gradient refers to the temperature gradient close to the surface of the part, e.g., in a region close to the interface between the part and the annealing gas. In another embodiment, the heating rate is controlled such that an internal temperature or thermal gradient within the part does not exceed about 10 Joules per kilogram per Kelvin (J/kg-K). In yet another embodiment, the heating rate is controlled to maintain both the external and internal thermal gradients to be below the respective limits throughout the first time period.

For yttria samples that have been sintered in an oxygen-containing atmosphere, a lower heating rate may be needed during the ramp-up heating stage in order to avoid undesirable thermal stress, e.g., about a factor of three to five slower than other samples with comparable geometric shapes and thicknesses but sintered in an inert or non-oxidative atmosphere. Thus, the heating rates may be controlled such that the external temperature gradient is between about 0.2 to about 0.3 K/cm, and the internal temperature gradient is between about 2 to about 3 J/kg-K. In one embodiment, the heating rate is controlled such that the external temperature gradient does not exceed about 0.3 K/cm. Alternatively, the heating rate is controlled such that the internal temperature gradient does not exceed about 3 J/kg-K.

The annealing temperature used in the second stage depends on the specific yttria part, and may also depend on the additives used in the parts. In general, the annealing temperature should be at least about 200 Kelvin lower than the eutectic point for the material composition. For the yttria parts of interest, a range of about 200 degrees Celsius to about 1000 degrees Celsius can be used, while in one embodiment, the annealing temperature is between about 800 degrees Celsius to about 1000 degrees Celsius. The time period for the second stage depends on the specific part, e.g., dimension, shape or compositions. Parts that are relatively large, or those with shapes that may be prone to mechanical stress, will generally require a longer annealing period. For some embodiments, the annealing period may span over several days, e.g., from 4 to about 7 days.

In the ramp-down cooling stage, the part is cooled at a controlled rate according to similar criteria in order to minimize thermal stress that might otherwise arise at excessively high cooling rates. In one embodiment, the part is cooled at a steady or constant rate that is approximately the same as that used during ramp-up heating.

Although the method can generally be used to fabricate a variety of yttria parts of different dimensions or shapes, it is particularly beneficial for certain machined parts that are more prone to mechanical stress, e.g., parts with openings or angular portions or shapes.

Embodiments of this invention can be used to fabricate yttria parts for a variety of applications. These improved parts are also suitable for use in corrosive environments such as those encountered in plasma processes. A variety of plasma deposition and etch chambers may benefit from the teachings disclosed herein, for example, dielectric etch chambers such as the ENABLERS etch chamber, which may be part of a semiconductor wafer processing system such as the CENTURA® system, the eMax etch chamber, the Producer etch chamber, as well as conductor etch chambers such as AdvantEdge Metal and the DPS Metal chambers, among others, all of which are available from Applied Materials, Inc. of Santa Clara, Calif. Details of the ENABLER® chamber have been disclosed in U.S. Pat. No. 6,853,141, "Capacitively Coupled Plasma Reactor with Magnetic Plasma Control," which is herein incorporated by reference in its entirety. It is contemplated that other plasma reactors, including those from other manufacturers, may be adapted to benefit from the invention.

Figure 2:
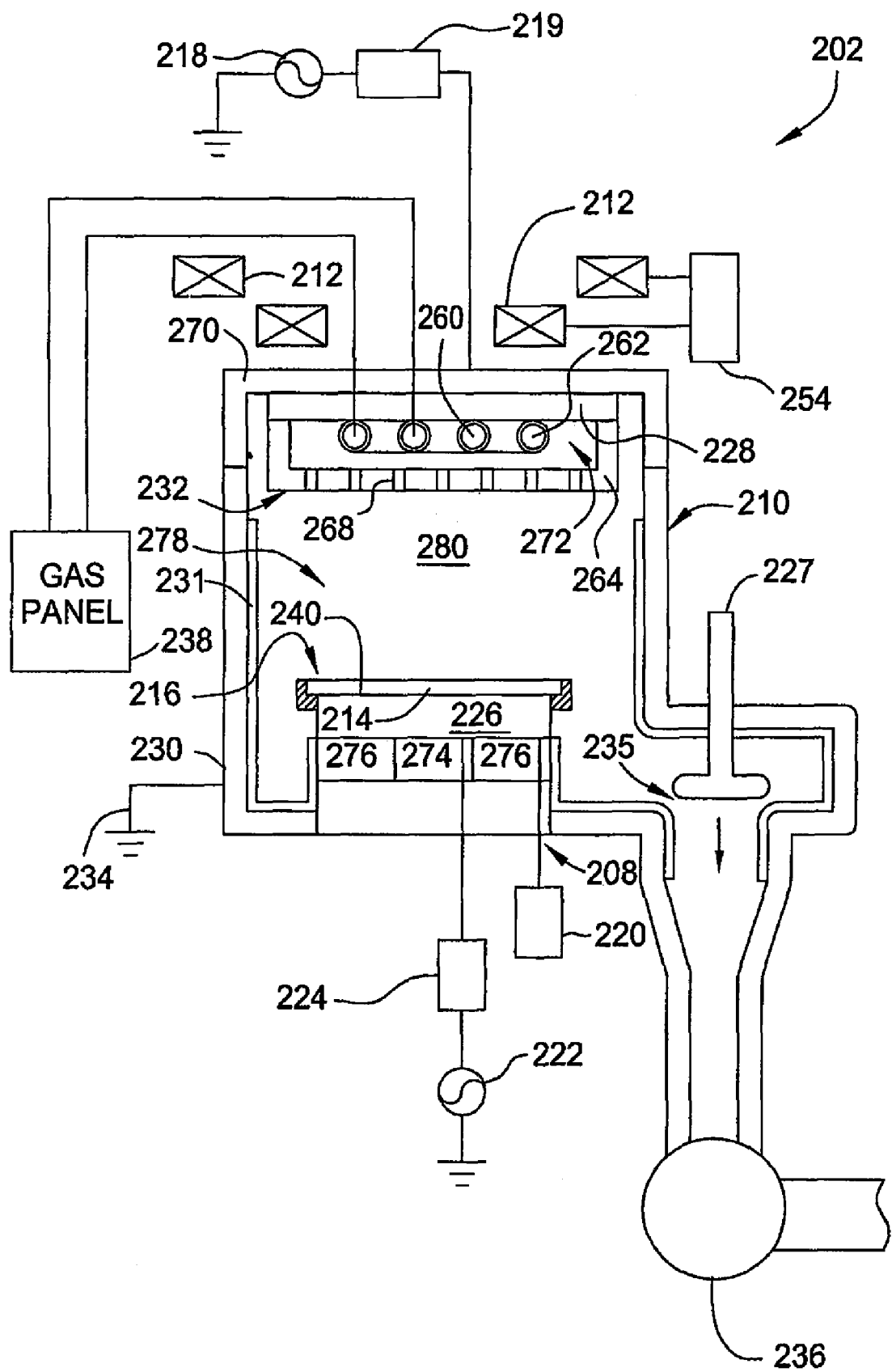
FIG. 2 is a schematic diagram of a plasma etch reactor having at least one bulk yttria part made according to a method of FIG. 1.

FIG. 2 depicts a schematic, cross-sectional diagram of an illustrative plasma processing chamber 202 that can benefit from embodiments of this invention. The embodiment of the reactor shown herein is provided for illustrative purposes and should not be used to limit the scope of the invention, as it is contemplated that parts fabricated using the method 100 described herein may be beneficially utilized in other processing chambers, including those from other manufacturers.

In this embodiment, chamber 202 is used for plasma processing, e.g., etching, of a substrate 214. Process uniformity can be tuned by using a gas diffuser 232, which is designed to enable compensation for conductance or other chamber attributes that cause asymmetrical processing, i.e., processing results that are not symmetrically relative to a centerline of the substrate.

In one embodiment, chamber 202 comprises a vacuum chamber body 210 having a conductive chamber wall 230 and bottom 208. The chamber wall 230 is connected to an electrical ground 234. A lid 270 is disposed on the chamber wall 230 to enclose an interior volume 278 defined within the chamber body 210. At least one solenoid segment 212 is positioned exterior to the chamber wall 230. The solenoid segment(s) 212 may be selectively energized by a DC power source 254 that is capable of producing at least 5V to provide a control knob for plasma processes formed within the processing chamber 202.

A ceramic liner 231 is disposed within the interior volume 278 to facilitate cleaning of the chamber 202. The byproducts and residue of the etch process may be readily removed from the liner 231 at selected intervals.

A substrate support pedestal 216 is disposed on the bottom 208 of the process chamber 202 below the gas diffuser 232. A process region 280 is defined within the interior volume 278 between the substrate support pedestal 216 and the diffuser 232. The substrate support pedestal 216 may include an electrostatic chuck 226 for retaining a substrate 214 on a surface 240 of the pedestal 216 beneath the gas diffuser 232 during processing. The electrostatic chuck 226 is controlled by a DC power supply 220.

The support pedestal 216 may be coupled to an RF bias source 222 through a matching network 224. The bias source 222 is generally capable of producing an RF signal having a tunable frequency of 50 kHz to 13.56 MHz and a power of between 0 and 5000 Watts. Optionally, the bias source 222 may be a DC or pulsed DC source.

The support pedestal 216 may also include inner and outer temperature regulating zones 274, 276. Each zone 274, 276 may include at least one temperature regulating device, such as a resistive heater or a conduit for circulating coolant, so that the radial temperature gradient of the substrate disposed on the pedestal may be controlled.

The interior of the chamber 202 is a high vacuum vessel that is coupled to a vacuum pump 236 through an exhaust port 235 formed through the chamber wall 230 and/or chamber bottom 208. A throttle valve 227 disposed in the exhaust port 235 is used in conjunction with the vacuum pump 236 to control the pressure inside the processing chamber 202. The position of the exhaust port 235 and other flow restrictions within the interior volume 278 of the chamber body 210 greatly influence the conductance and gas flow distribution within the processing chamber 202.

The gas diffuser 232 provides a conduit through which at least one process gas is introduced into the processing region 280 in an asymmetrical manner that may be used to tune the conductance and gas flow distribution described above that are caused by the other chamber components (i.e., location of the exhaust port, geometry of the substrate support pedestal or other chamber component) so that the flow of gases and species are delivered to the substrate in a uniform, or selected, distribution. Moreover, the gas diffuser 232 may be utilized to position the plasma relative to the centerline of the substrate 214 (which is concentrically disposed on the pedestal 216). As a result, the configuration of the gas diffuser 232 may be selected to improve process uniformity, or alternatively, create a predefined offset in processing results. For example, the configuration of the gas diffuser 232 may be selected to direct the flow of gas entering the process region 280 above the substrate support pedestal 216 in a manner that compensates for the chamber conductance. This may be accomplished by configuring the gas diffuser 232 to deliver gas into the process chamber with an asymmetry that offsets the asymmetric effects of the chamber conductance on plasma location and/or the delivery of ions and/or reactive species to the surface of the substrate during processing.

Figure 4:
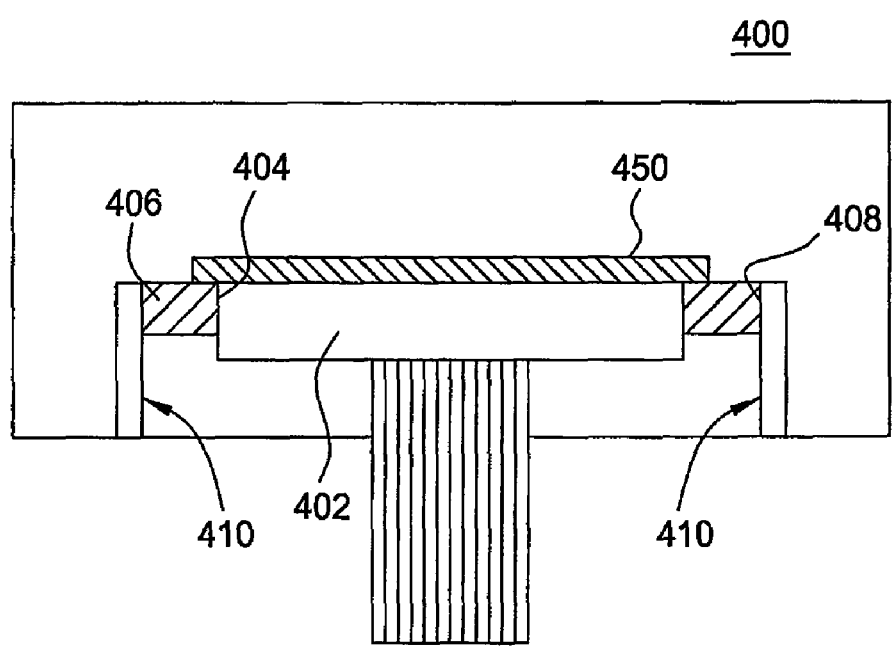
FIG. 4 is a schematic illustration of a cross-sectional view of several component parts inside a chamber.

In the embodiment depicted in FIG. 4, the gas diffuser 232 includes at least two gas distributors 260, 262, a mounting plate 228 and a gas distribution plate 264.

The gas distributors 260, 262 are coupled to one or more gas panels 238 through the lid 270 of the processing chamber 202, and are also coupled to at least one of the mounting or gas distribution plates 228, 264. The flow of gas through the gas distributors 260, 262 may be independently controlled. Although the gas distributors 260, 262 are shown coupled to a single gas panel 238, it is contemplated that the gas distributors 260, 262 may be coupled to one or more shared and/or separate gas sources. Gases provided from the gas panel 238 are delivered into a region 272 defined between the plates 228, 264, then exit through a plurality of apertures 268 formed through the gas distribution plate 264 into the processing region 280.

The mounting plate 228 is coupled to the lid 270 opposite the support pedestal 216. The mounting plate 228, which is fabricated from or covered by an RF conductive material, is coupled to an RF source 218 through an impedance transformer 219 (e.g., a quarter wavelength matching stub). The source 218 is generally capable of producing an RF signal having a tunable frequency of about 262 MHz and a power between about 0 and 2000 Watts. The mounting plate 228 and/or gas distribution plate 264 is powered by the RF source 218 to maintain a plasma formed from the process gases in the process region 280.

Figure 3:
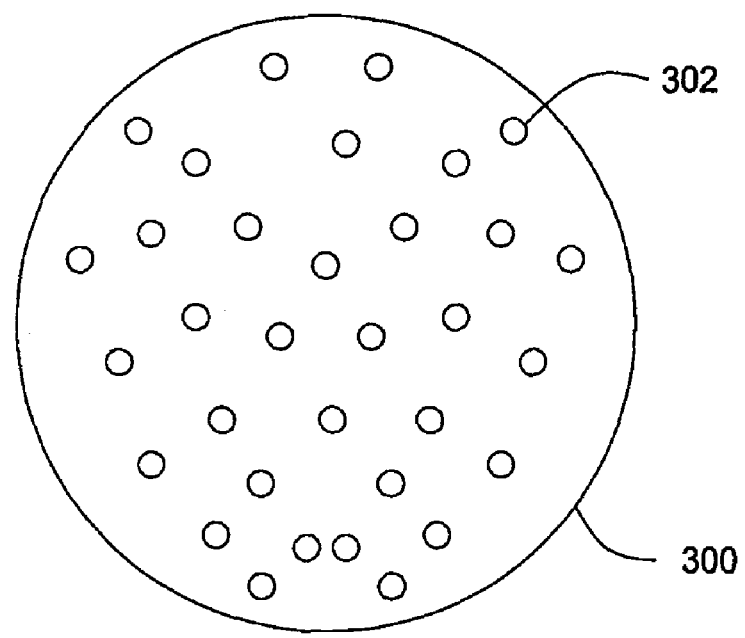
FIG. 3 is a schematic illustration of a top view of a gas distribution plate.

FIG. 3 is a schematic illustration of a top view of a gas distribution plate 300 that can be fabricated according to embodiments of this invention. The yttria gas distribution plate 300 can be used in chamber 202 or other plasma chambers, such as those for etching or deposition applications, among others. The gas distribution plate 300 is provided with a plurality of apertures or gas inlets 302 to allow passage of process gases and/or plasma species into a process region of the chamber. The apertures 302 may be arranged in a regular pattern on the gas distribution plate 300, or they may be arranged in different patterns to allow for different gas distribution needs. The gas distribution plate 300 may have a thickness ranging from about 0.125 inches to about 0.750 inches, and the apertures 302 may have diameters ranging from about 0.01 inch to about 0.03 inch.

In one embodiment, one or more process gases comprising at least one halogen-containing gas, e.g., fluorine-containing or chlorine-containing gas, is introduced into the chamber 202 via gas inlets 302. In general, a fluorine-containing gas, e.g., $CHF_3$, $CF_4$, among others, may be used for etching dielectric materials on the substrate 214, while a chlorine-containing gas such as chlorine ($Cl_2$), is used for etching materials such as metal. These types of etch processes can benefit from the use of yttria parts fabricated according to embodiments of the present invention because of improved corrosion resistance of the parts resulting in reduced maintenance and particle contamination.

FIG. 4 is a schematic illustration of a cross-sectional view of several component parts inside a process chamber 400, which may be a plasma chamber or a chamber designed for processing a substrate in a corrosive environment. The chamber 400 comprises a pedestal 402 for supporting a substrate 450. In one embodiment, the outer perimeter 404 of the pedestal 402 is surrounded by a ring 406, which is used to isolate the substrate, e.g., wafer, from other chamber components. The ring 406 can be attached or mounted to the pedestal 402 using a variety of suitable techniques.

For certain chambers such as those used for metal or conductor etching, the ring 406 may be made of yttria according to embodiments of the present invention. For other chambers such as those used for dielectric etching, a yttria liner 410 fabricated according to embodiments of the present invention may be provided around the outer perimeter 408 of the ring 406. The liner 410 protects the chamber walls by shielding them from the process gases or undesirable deposits. In the case of dielectric etching chamber, the ring 406 is typically made of other materials.

Figure 5A:
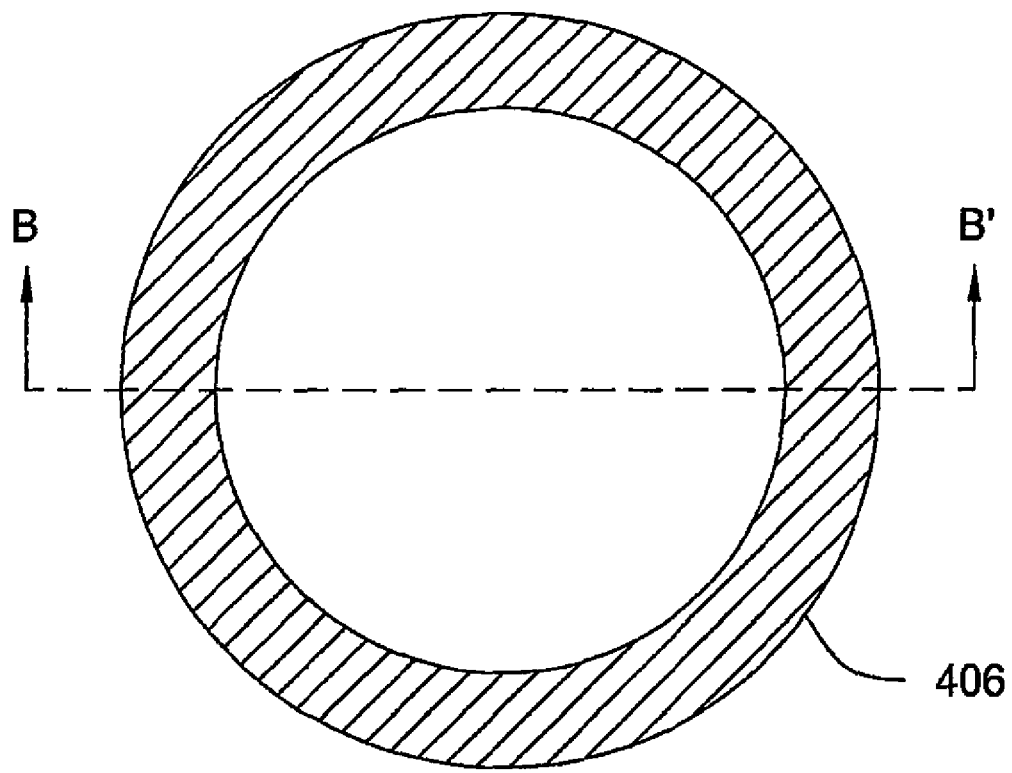
FIGS. 5A-B are schematic illustrations of the top and cross-sectional views of a yttria ring.
Figure 5B:

FIG. 5A is a schematic illustration of a top view of one embodiment of the ring 406 having an annular shape, and FIG. 5B shows a cross-sectional view taken along the line BB'. In one embodiment, the ring 406 has a thickness of about 0.3 cm, and an inner diameter of about 30 cm. and an outer diameter of about 35 cm. Since the geometric shape and the thickness of this ring do not contribute to excessive mechanical stress or strain, the ramp-up heating and ramp-down cooling during the annealing stage can be performed under less stringent requirements, e.g., at a heating or cooling rate such that an external temperature gradient does not exceed about 1 Kelvin per centimeter (K/cm) near the surface of the part, or an internal temperature or thermal gradient within the part does not exceed about 10 Joules per kilogram per Kelvin (J/kg-K).

While the foregoing is directed to embodiments of the present invention, other and further embodiments of the invention may be devised without departing from the basic scope thereof, and the scope thereof is determined by the claims that follow.

The invention claimed is:

1. A method of fabricating a yttria part, comprising:
 (a) sintering a yttria sample in a sintering atmosphere;
 (b) machining the sintered yttria sample to form a part; and
 (c) annealing the part; wherein (c) further comprises:
  (c1) exposing the part to an annealing gas in an enclosure;
  (c2) heating the part from a first temperature to a second temperature over a first time period;
  (c3) maintaining the part at the second temperature for a second time period; and
  (c4) cooling the part from the second temperature to the first temperature over a third time period;
 wherein at least one of the sintering and annealing is performed in an oxygen-containing atmosphere, and (c2) and (c4) are performed at respective predetermined heating and cooling rates, the predetermined heating and cooling rates being selected based on at least the sintering atmosphere.

2. The method of claim 1, wherein the sintering atmosphere comprises an oxygen concentration of at least 2 percent by volume.

3. The method of claim 2, wherein during (c2), a temperature gradient in a surface region of the part is less than about 0.3 Kelvin per centimeter throughout the first time period.

4. The method of claim 2, wherein during at least one of (c2) or (c4), an internal thermal gradient within the part is less than about 3 Joules per kilogram per Kelvin throughout the first or third time period.

5. The method of claim 2, wherein during (c4), a temperature gradient in a surface region of the part is less than about 0.3 Kelvin per centimeter throughout the third time period.

6. The method of claim 1, wherein the annealing gas has a composition selected from the group consisting of an oxygen-containing mixture, air, an inert gas, forming gas, a reducing gas composition, and an oxidizing gas composition.

7. The method of claim 1, wherein the annealing gas is one of an oxygen-containing mixture, air, nitrogen, argon, and mixtures thereof, and is provided in one of a static or flow condition.

8. The method of claim 1, wherein the second temperature is between about 200 degrees Celsius and about 1000 degrees Celsius.

9. The method of claim 8, wherein the second temperature is between about 800 degrees Celsius and about 1000 degrees Celsius.

10. The method of claim 1, wherein the sintering is performed in one or an inert or non-oxidative atmosphere, and the annealing gas has an oxygen concentration of at least 10% percent.

11. The method of claim 10, wherein the annealing gas is provided in one of a static or flow condition.

12. The method of claim 10, wherein the second temperature is between about 200 degrees Celsius and about 1000 degrees Celsius.

13. The method of claim 12, wherein the second temperature is between about 800 degrees Celsius and about 1000 degrees Celsius.

14. The method of claim 10, wherein during (c2), a temperature gradient in a surface region of the part is less than about 1 Kelvin per centimeter throughout the first time period.

15. The method of claim 10, wherein during at least one of (c2 or c4), an internal thermal gradient within the part is less than about 10 Joules per kilogram per Kelvin throughout the first or third time period.

16. The method of claim 10, wherein during (c4), a temperature gradient in a surface region of the part is less than about 1 Kelvin per centimeter throughout the third time period.

17. The method of claim 1, wherein the yttria sample in (b) has a purity level of at least about 99.5 percent, and the part is a component part of a plasma reactor.

18. The method of claim 17, wherein the part is one of a lid, an ion shield plate, an ion shield leg, a gas distribution plate, a ring, or a chamber liner.

19. A plasma process chamber, comprising:
a chamber body;
a part made of at least about 99.5 percent yttria disposed in the chamber body, wherein the part has a single-phase microcrystallite structure;
a support pedestal disposed in the chamber body and adapted to receive a substrate thereon; and
a power source for forming a plasma within the chamber.

20. The plasma process chamber of claim 19, wherein the part is one of a lid, an ion shield plate, an ion shield leg, a gas distribution plate, a ring, or a chamber liner.

* * * * *

UNITED STATES PATENT AND TRADEMARK OFFICE
CERTIFICATE OF CORRECTION

| | |
|---|---|
| PATENT NO. | : 7,919,722 B2 |
| APPLICATION NO. | : 11/766626 |
| DATED | : April 5, 2011 |
| INVENTOR(S) | : Ryabova et al. |

It is certified that error appears in the above-identified patent and that said Letters Patent is hereby corrected as shown below:

In the Detailed Description:

Column 5, Line 60, please delete "ENABLERS" and insert --ENABLER®-- therefor;

Column 6, Line 48, please delete "Wafts" and insert --Watts-- therefor.

Signed and Sealed this
Twelfth Day of July, 2011

David J. Kappos
*Director of the United States Patent and Trademark Office*